(12) United States Patent
Muri et al.

(10) Patent No.: US 10,199,372 B2
(45) Date of Patent: Feb. 5, 2019

(54) MONOLITHICALLY INTEGRATED CHIP INCLUDING ACTIVE ELECTRICAL COMPONENTS AND PASSIVE ELECTRICAL COMPONENTS WITH CHIP EDGE STABILIZATION STRUCTURES

(71) Applicant: Infineon Technologies AG, Neubiberg (DE)

(72) Inventors: Ingo Muri, Villach (AT); Iris Moder, Villach (AT); Oliver Hellmund, Neubiberg (DE); Johannes Baumgartl, Riegersdorf (AT); Annette Saenger, Villach (AT); Barbara Eichinger, Villach (AT); Doris Sommer, Villach (AT); Jacob Tillmann Ludwig, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/631,006

(22) Filed: Jun. 23, 2017

(65) Prior Publication Data

US 2018/0374843 A1 Dec. 27, 2018

(51) Int. Cl.
*H01L 27/108* (2006.01)
*H01L 29/94* (2006.01)
*H01L 29/76* (2006.01)
*H01L 27/06* (2006.01)
*H01L 23/48* (2006.01)
*H01L 21/768* (2006.01)

(52) U.S. Cl.
CPC .... *H01L 27/0629* (2013.01); *H01L 21/76898* (2013.01); *H01L 23/481* (2013.01)

(58) Field of Classification Search
CPC ......... H01L 2924/00; H01L 2924/0002; H01L 27/0207; H01L 23/528; H01L 2224/32225; H01L 22/26; H01L 29/41725; H01L 2224/48227; H01L 2924/00014; H01L 29/0649; H01L 22/34; H01L 27/088; H01L 27/10852
See application file for complete search history.

(56) References Cited

U.S. PATENT DOCUMENTS

| | | | | | |
|---|---|---|---|---|---|
| 4,224,734 | A | * | 9/1980 | Tiefert | H01L 21/30608 257/E21.223 |
| 5,119,155 | A | * | 6/1992 | Hieda | H01L 27/10829 257/304 |
| 5,591,665 | A | * | 1/1997 | Bodensohn | H01L 21/764 257/521 |
| 5,990,562 | A | * | 11/1999 | Vallett | H01L 22/32 257/48 |
| 6,607,928 | B1 | * | 8/2003 | Eiles | H01L 23/3677 257/E23.105 |

(Continued)

*Primary Examiner* — Meiya Li
(74) *Attorney, Agent, or Firm* — Viering, Jentschura & Partner (57) ABSTRACT

An integrated circuit device including a chip die having a first area with a first thickness surrounding a second area with a second thickness, the first thickness is greater than the second thickness, the chip die having a front-side and a back-side, at least one passive electrical component provided at least one of in or over the chip die in the first area on the front-side, and at least one active electrical component provided at least one of in or over the chip die in the second area on the front-side.

25 Claims, 10 Drawing Sheets

(56) References Cited

U.S. PATENT DOCUMENTS

| | | | | |
|---|---|---|---|---|
| 6,686,634 B2* | 2/2004 | Ishio | ............... | G01L 9/0042 |
| | | | | 257/394 |
| 6,803,294 B2* | 10/2004 | Kouno | ............... | H01L 29/66333 |
| | | | | 257/E21.237 |
| 2006/0131691 A1* | 6/2006 | Roozeboom | ...... | H01L 21/76898 |
| | | | | 257/534 |
| 2007/0064395 A1* | 3/2007 | Chen | ............... | H01L 21/4871 |
| | | | | 361/699 |
| 2007/0298564 A1* | 12/2007 | Brar | ............... | H01L 27/0629 |
| | | | | 438/212 |
| 2009/0108288 A1* | 4/2009 | Ozeki | ............... | H01L 21/84 |
| | | | | 257/133 |
| 2015/0108549 A1* | 4/2015 | Benoit | ............... | H01L 29/7378 |
| | | | | 257/197 |
| 2016/0240454 A1* | 8/2016 | Perkins | ............... | H01L 23/367 |
| 2017/0170131 A1* | 6/2017 | Roozeboom | ............ | H01L 23/66 |

* cited by examiner

MONOLITHICALLY INTEGRATED CHIP INCLUDING ACTIVE ELECTRICAL COMPONENTS AND PASSIVE ELECTRICAL COMPONENTS WITH CHIP EDGE STABILIZATION STRUCTURES

TECHNICAL FIELD

Various embodiments relate generally to a monolithic integration of passive electrical components and active electrical components on thin and ultra-thin silicon semiconductor devices.

BACKGROUND

Typically, the active components (e.g., transistors and diodes) and passive components (e.g., capacitors, inductors, resistors) used in circuits for power applications are formed in separated discrete packages. Although passive components, such as capacitors, may be realized on a chip level, the integration of large capacitors is either difficult with power devices (e.g., insulated-gate bipolar transistors) or costly. Currently, there are two ways to integrate capacitors on the same die as a semiconductor device. One approach relies on vertical integration of capacitive structures into the chip die which requires etching deep trenches into the chip die. Larger capacitances require deeper trenches. However, the chip die for power devices should be as thin as possible to achieve low RDSon and favorable thermal behavior. A second approach relies on the lateral integration of capacitive structures into the chip die. This approach however requires forming metal layers over large areas of the chip die which is space-consuming and very costly.

SUMMARY

In various embodiments, an integrated circuit device is provided. The integrate circuit device including a chip die having a first area with a first thickness surrounding a second area with a second thickness, the first thickness is greater than the second thickness, the chip die having a front-side and a back-side, at least one passive electrical component provided at least one of in or over the chip die in the first area on the front-side, and at least one active electrical component provided at least one of in or over the chip die in the second area on the front-side.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Various embodiments of the invention are explained in greater detail below, with reference to the accompanying figures. However, the invention is not restricted to the embodiments specifically described, but rather can be more suitably modified and altered. It lies within the scope of the invention to combine individual features and feature combinations of one embodiment with features and feature combinations of another embodiment in order to arrive at further embodiments according to the invention.

Identical elements are provided with the same or similar reference signs in the figures. A repeated description of these elements has been dispensed with in order to avoid repetition.

The basic principle presented here will be elucidated on the basis of the examples given below.

In accordance with various embodiments, one or more integrated circuits and one or more passive components integrated on a monolithic silicon chip having a thick chip-edge structure for mechanical stability and for formation of one or more passive components is provided.

In accordance with various embodiments, a support structure may be provided along the outer edge of a chip die so as to realize a stable chip die having areas of varying thicknesses so that one or more passive electrical components (e.g., capacitors, resistors, inductors, etc.) formed in or over the thicker areas and one or more active electrical components (e.g., power transistors and diodes) formed in or over the thinner areas may be integrated into a monolithic chip.

In accordance with various embodiments, a chip die may be processed to remove one or more portions of the chip die from the back side of the chip die keeping the edge of the chip die intact so as to provide at least a support structure (e.g., a ring) on the outer edge of the wafer.

In accordance with various embodiments, semiconductor material may be removed from a backside of a chip die to create areas of varying thicknesses on a chip die while maintaining a planar surface on the front-side of the chip die and minimizing impact to the structural integrity of the chip die.

Figure 1A:
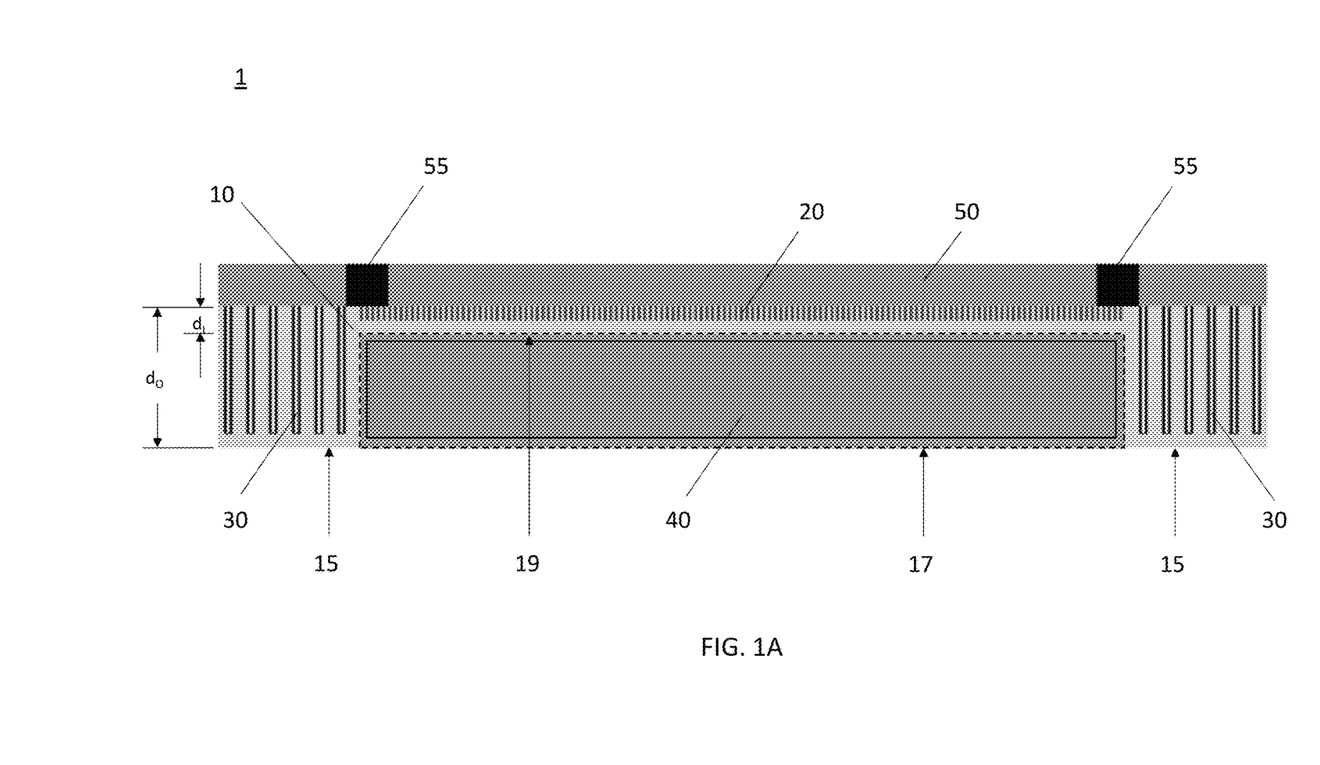
FIG. 1A is cross-sectional view of a monolithically integrated circuit device with at least one active electrical component and at least one passive electrical component according to various embodiments.

FIG. 1A is a cross-sectional view of a monolithically integrated circuit device 1 with at least one active electrical component and at least one passive electrical component according to various embodiments. The integrated circuit device 1 may, for example, be a semiconductor chip or a part thereof. The integrated circuit device 1 shown in FIG. 1A includes a chip die 10 having a thickness $d_I$ in an inner portion of the chip die and a thickness $d_O$ in an outer portion of the chip die. At least one active electrical component 20 may be disposed in the inner portion of a chip die and at least one passive electrical component 30 may be disposed in the outer portion of the chip die. The integrated circuit device 1 also includes a support layer 40, a front side metal layer 50, and an insulator 55. The at least one active electrical component 20 may be a power transistor. The at least one passive electrical component may be a capacitor.

Figure 1B:
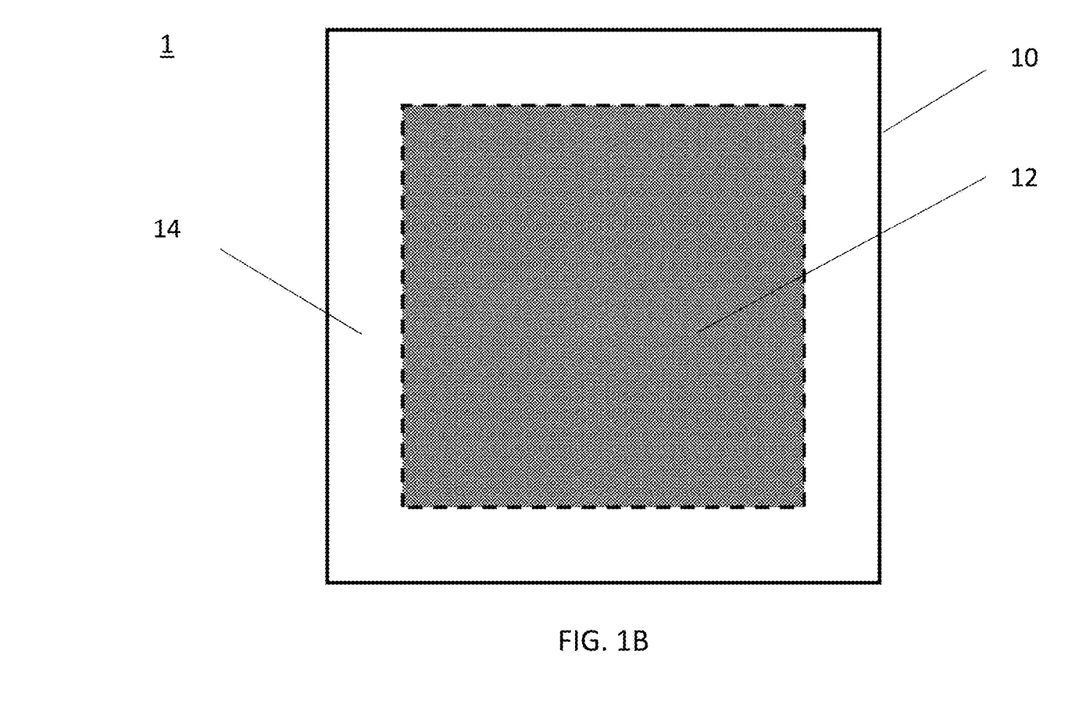
FIG. 1B is a top view of an integrated circuit device of FIG. 1A indicating the areas of the chip die having different thicknesses.

FIG. 1B is a top view of integrated circuit device 1 indicating areas of the chip die 10 having different thicknesses. Referring to FIGS. 1A-1B, the thickness $d_I$ of the chip die in an inner (recessed) area 12 of the chip die 10 is thinner than the thickness $d_O$ of the chip die in a border (support) area 14 of the chip die 10 that surrounds the inner area 12. For example, $d_I$ may be less than about 20 μm and $d_O$ may be in the range from about 20 μm to about 100 μm. In various embodiments, $d_I$ may be in the range from about 2 μm to about 20 μm. Thus, the chip die 10 may accommodate both active components such as transistors and diodes that require thin substrates in the inner area 12 and passive components such as capacitors, inductors, and resistors that require thicker substrates in the border area 14. In various embodiments, one or more passive electrical components 30 may be formed in or over the chip die 10 in the border area 14 and one or more active electrical components 20 may be formed in or over the chip die 10 in the inner area 12.

Referring to FIG. 1A, the chip die 10 includes a cavity 17 (indicated by a dotted box) on the back-side of the chip die 10 corresponding to the inner area 12 of the chip die 10. The cavity 17 has an opening facing away from the front-side of the chip die 10. The portion of the chip die 10 in the inner area 12 forms a roof 19 of the cavity 17. The portion of the chip die 10 in the border area 14 forms a support structure 15 around the chip-edge that supports the roof 19. The support structure 15 may be at least 10 μm deep. The support structure 15 may form the sidewalls of the cavity 17. The sidewalls may be perpendicular or tapered. The depth of the cavity 17 may be in the range from about 10 μm to about 190 μm.

The support structure 15 provides the chip die mechanical stability. The width and thickness of the support structure 15 may be configured depending on the area and thinness of the roof 19. The dimensions may also depend on the size of the one or more passive electrical elements provided in or over the support structure 15. For example, if the thickness of the roof may be in the range from about 1 μm to about 50 μm, the thickness of the support structure may be in the range from about 25 μm to about 200 μm. For example, if the thickness of the roof may be in the range from about 1 μm to about 10 μm, the thickness of the support structure may be in the range from about 15 μm to about 200 μm. For example, if the thickness of the roof may be in the range from about 1 μm to about 5 μm, the thickness of the support structure may be in the range from about 10 μm to about 200 μm. For example, the width of the support structure may be in the range from about 1 μm to about 1 cm. For example, the width of the support structure may be in the range from about 5 μm to about 500 μm.

For additional mechanical stability, the cavity 17 may be filled with a material to form a support layer 40. Since the support layer 40 is disposed under the portion of the chip die 10 where one or more active components are formed, the material used in the support layer may be a thermally conductive material such as a metal so that the support layer can also act as a heat sink for the one or more active components. The material used in the support layer may also be an electrically conductive material such as a metal so that the support layer can also be electrically coupled to at least one active electrical component and/or at least one passive electrical component and may act as a connecting layer or electrical contact for a gate, source, or drain on the back-side of the chip die 10. In various embodiments, the cavity 17 may be deposited with different forms of low stress metal such as porous copper which may be deposited by spraying, electroplating, or printing. The thickness of the support layer depends on the metals used. A copper support layer should be at least 1 μm thick.

The chip die 10 described herein can be made of any suitable semiconductor material. Examples of such materials include, without being limited thereto, elementary semiconductor materials such as silicon (Si) and other group IV compound semiconductor materials. Suitable materials may also include gallium nitride (GaN) and silicon carbide (SiC). The chip die 10 may include a semiconductor substrate layer or a semiconductor substrate layer with an epitaxial layer.

The at least one active electrical component 20 and the at least one passive electrical component 30 may be fabricated using any suitable and well-known semiconductor manufacturing techniques. The at least one active electrical component 20 may be, for example, a transistor or diode. In various embodiments, the at least one active electrical component 20 may be a power device including one or more insulated-gate bipolar transistors (IGBTs). In various embodiments, it may be an integrated circuit such as a driver circuit.

The at least one passive component 30 may be a capacitor such as a deep trench capacitor fabricated in the support structure 15 using any suitable and well-known semiconductor manufacturing techniques. For example, a deep trench capacitor may be created in the support structure 15 by forming a trench, depositing a layer of conductive material in the trench, then depositing a layer of insulation (dielectric material) in the trench, and then depositing another layer of conductive material in the trench.

Capacitors having increased capacitance may be realized using closely packed arrays of deep trench capacitors having extremely high trench aspect ratios. The depth of the trenches may range from about 20 μm to about 50 μm. Each trench may have high aspect-ratios ranging from about 20:1 to about 120:1. The trenches may be formed by etching the substrate. In various embodiments, 50 μm deep trenches may be etched in a support structure 15 that has a depth of 100 μm.

In various embodiments, the front side metal layer 50 may have a thickness in the range from about 20 μm to about 100 μm. In other embodiments, the front side metal layer 50 may have a thickness in the range from about 10 μm to about 20 μm. In further embodiments, the front side metal layer 50 may have a thickness in the range from about 1 μm to about 10 μm.

The insulator 55 may be made of imide having a thickness that corresponds to the thickness of the front side metal layer 50. The insulator 55 may be used to isolate portions of the front side metal layer 50.

The different layers and electrical components may be coupled by any suitable and well-known interconnection methods. For example, Through-Silicon-Vias (TSVs) may be used to create vertical connections through the body of the chips for various interconnections. TSVs may be used to combine passive components with active component circuits. TSVs may also be used to connect multiple active component circuits together.

Figure 2A:
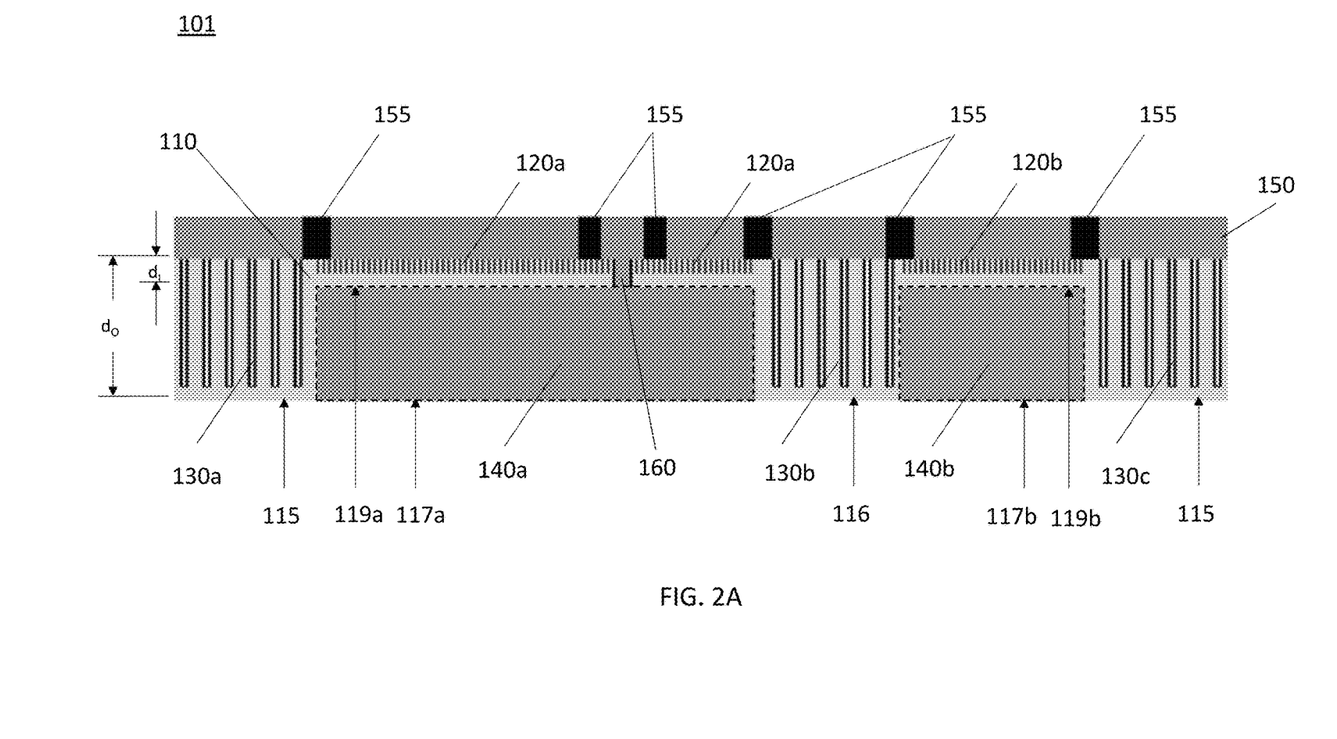
FIG. 2A is a cross-sectional view of a monolithically integrated circuit device with a first circuit, a second circuit, and one or more passive electrical component according to various embodiments.
Figure 2B:
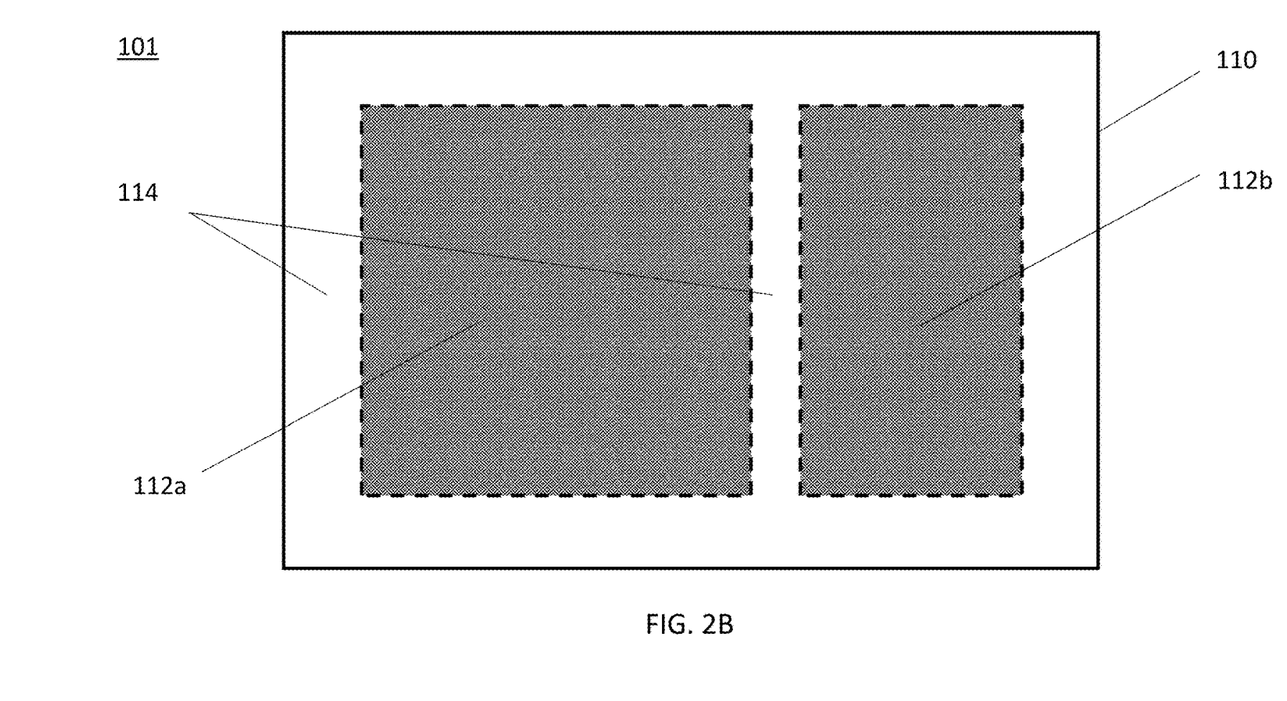
FIG. 2B is a top view of an integrated circuit device of FIG. 2A indicating the areas of the chip die having different thicknesses.

In various embodiments, a chip die may have a plurality of recesses on the backside of the chip die and a support structure provided on the outer edge and across portions of the chip die. In various embodiments, an integrated circuit device may have a chip die including a plurality of areas with different thicknesses. FIG. 2A is a cross-sectional view of a monolithically integrated device 101 with a first circuit, a second circuit, and one or more passive electrical component according to various embodiments. FIG. 2B is a top view of integrated circuit device 101 indicating areas of the chip die 110 having different thicknesses.

Referring to FIGS. 2A and 2B, the chip die 110 includes cavities 117a and 117b (indicated by dotted boxes) on the back-side of the chip die 110 corresponding to the inner areas 112a and 112b of the chip die 110, respectively. The cavities 117a and 117b have openings facing away from the front-side of the chip die 110. The portion of the chip die 110 in the inner area 112a forms a roof 119a of the cavity 117a. The portion of the chip die 110 in the inner area 112b forms a roof 119b of the cavity 117b. The portion of the chip die 110 in the border area 114 around the chip-edge and around the cavities 117a and 117b forms a support structure 115 including at least one crossbeam 116 that supports the roofs 119a and 119b. The support structure 115 may be at least 10 µm deep. The support structure 115 may form the sidewalls of the cavities 117a and 117b. The sidewalls may be perpendicular or tapered. The cavities 117a and 117b may be deposited with a material to form support layers 140a and 140b, respectively. In various embodiments, the cavities 117a and 117b may be deposited with different forms of low stress metal such as, for example, porous copper.

Referring to FIGS. 2A-2B, the thicknesses $d_I$ of the chip die in the inner areas 112a and 112b of chip die 110 are thinner than the thickness $d_O$ of the chip die in the border areas 114 of the chip die 110 that surround the inner areas 112a and 112b. For example, $d_I$ may be less than about 20 µm and $d_O$ may be in the range from about 20 µm to about 200 µm. The portions of the chip die 110 in the border areas 114 around the chip-edge and across portions of the chip die form a support structure 115 with at least one crossbeam 116. The support structure 115 having a crossbeam 116 may provide a larger chip die with additional torsional stability. The widths and thicknesses of different portions of the support structure 115 may be configured depending on the area and thinness of the chip die 110 in the inner areas 112a and 112b. For example, the width and thickness of the crossbeam 116 may be different than the width and thickness of the portion of the support structure 115 along the outer edge of the chip die 110. The crossbeam 116 may also isolate active component areas and provide additional areas for passive electrical components. There may be multiple crossbeams 116 in the support structure 115. The crossbeams 116 of the support structure 115 may be parallel to each other or may intersect with each other.

The integrated circuit device 101 shown in FIG. 2A includes a circuit 120a disposed in or over a portion of the chip die 110 in inner area 112a, a circuit 120b disposed in or over a portion of the chip die 110 in inner area 112b, and at least one passive electrical component 130a, 130b, and/or 130c disposed in or over a portion of the chip die 110 in the border area 114. The integrated circuit device 101 also includes support layers 140a and 140b, a front side metal layer 150, a plurality of insulators 155, and at least one Through-Silicon-Via (TSV) 160. In various embodiments, the circuit 120a may be a power transistor, the circuit 120b may be a driver circuit, and the at least one passive electrical component 130 may be at least one deep trenched capacitor.

In various embodiments, one or more passive electrical components may be formed in the chip die 110 in the border areas 114 (i.e., in or over the support structure 115 including the at least one crossbeam 116) and one or more active electrical components may be formed in the chip die 110 in the inner areas 112a and 112b (i.e., in or over the roofs 119a and 119b). In various embodiments, the thicknesses of the chip die 110 in the inner area 112a and may be different than the thicknesses of the chip die 110 in the inner area 112b. A plurality of deep trench capacitors 130a-130c may be formed in the semiconductor substrate in the border areas 114.

In various embodiments, a chip die may have more than two cavities on the back side.

Figure 3:
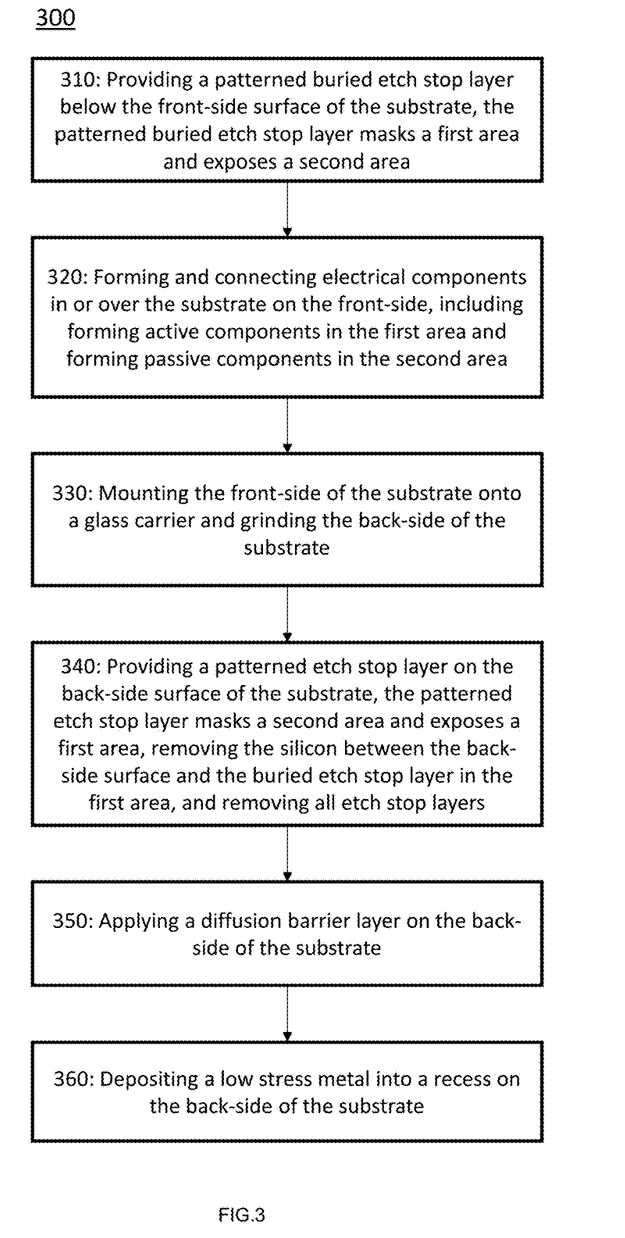
FIG. 3 shows a flow chart for manufacturing a monolithically integrated circuit with one or more active electrical components in a first area and one or more passive electrical components in a second area according to various embodiments.

Many different processes may be used to produce a monolithically integrated circuit device with one or more active components and one or more passive components on a chip die having one or more recesses on the back side of the chip die and a support structure provided at least on the edge of the chip die. One possible process flow is shown in FIG. 3 which shows a flow chart of a process 300 for manufacturing a monolithically integrated circuit with one or more active electrical components in a first area and one or more passive electrical components in a second area according to various embodiments. A chip die having areas of different thicknesses may be formed by a combination of suitable and well-known lithography techniques. The process flow is described with respect to a chip die of a semiconductor wafer. The process flow may be applied to an entire wafer by extending the patterning for a single chip die to a suitable and appropriate patterning for a wafer. FIGS. 4A-4F are cross-sectional views of a chip die in various stages in forming a monolithically integrated circuit with one or more active electrical components and one or more passive electrical components according to various embodiments.

At 310, a patterned buried etch stop layer 410 may be formed below the front-side surface of the chip die. The patterned buried etch stop layer 410 indicates where areas of thinner chip die and areas of thicker chip die will be formed. The thinner chip die may be provided for the formation of active components and the thicker chip die may be provided for the formation of passive components. For example, FIGS. 1B and 2B are top views of integrated circuit devices indicating areas of the chip die having different thicknesses. These areas correspond to patterns for the buried etch stop layers in the chip die. As shown in FIG. 1B, the area 12 of the chip die having a buried etch stop layer 410 corresponds to the area of the chip die where active components may be formed. The silicon substrate between the back-side surface and the buried etch stop layer 410 will be etched away in a subsequent process to reduce the thickness of the substrate and form at least one cavity on the back-side of the chip-die. In various embodiments, there may be one or more areas for active components. For example, referring to FIG. 2B, the areas 112a and 112b of the chip die having a buried etch stop layer 410 correspond to the areas of the chip die where active components may be formed. The areas having a buried etch stop layer may be any shape and is not limited to a rectangular shape. For example, it may be hexagonal or rounded. In various embodiments, any number of areas may be patterned to have a buried etch stop layer.

Referring to FIGS. 1B and 2B, the areas 14 and 114 of the chip die that do not have a buried etch stop layer correspond to the areas of the chip die where passive components may be formed. In various embodiments, the these areas may be along the edges of the perimeter of the chip die. Referring to FIG. 1B, the area 14 may be a ring around the edge of the chip die. In various embodiments, the areas where passive components may be formed may include a ring around the edge of the chip die and any areas adjacent to a cavity of the chip die. Referring to FIG. 2B, the areas 114 may include a ring around the edge of the chip die and a strip bordering areas 112a and 112b.

Figure 4A:
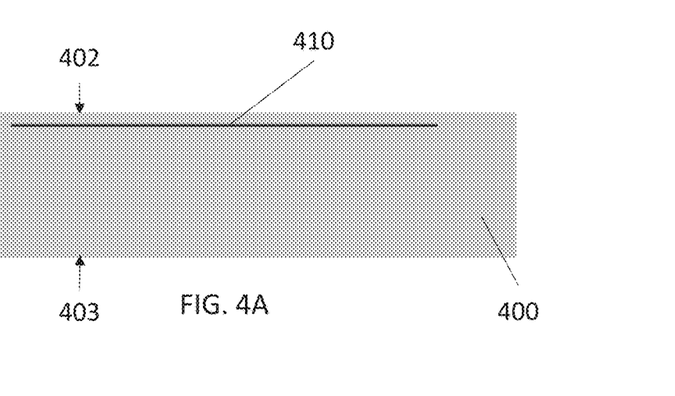
FIGS. 4A-4F are cross-sectional views of a semiconductor substrate of a chip die in various stages in forming a monolithically integrated circuit with one or more active electrical components and one or more passive electrical components according to various embodiments.

FIG. 4A shows a chip die 400 having a patterned buried etch stop layer 410. The patterned buried etch stop layer may be formed using any suitable and well-known semiconductor manufacturing techniques. For example, the buried etch stop layer may be implemented as a highly doped layer (e.g., boron doped p+ layer). As another example, the buried etch stop layer may be a buried oxide layer formed by an Epitaxial Lateral Overgrowth (ELO) process in which oxide islands are buried under an epitaxial layer or it may be a buried oxide layer formed by a Separation by IMplantation of OXygen (SIMOX) process which uses an oxygen ion beam implantation process followed by high temperature annealing to create a buried $SiO_2$ layer.

Figure 4B:
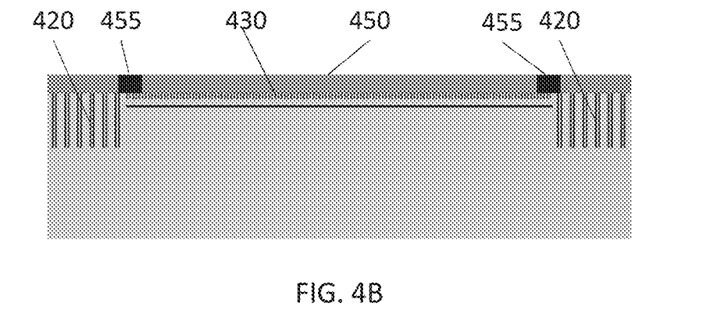
Figure 4C:
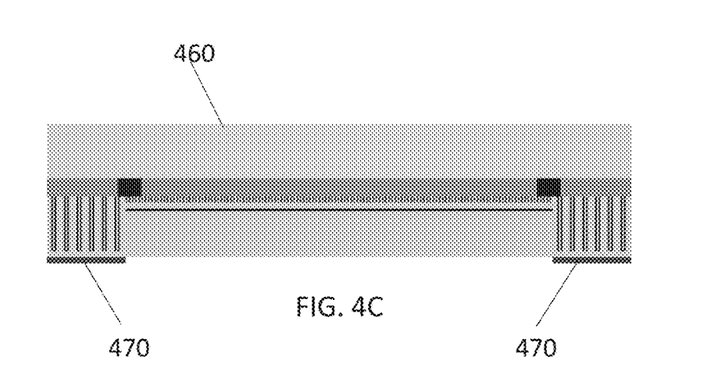
Figure 4D:
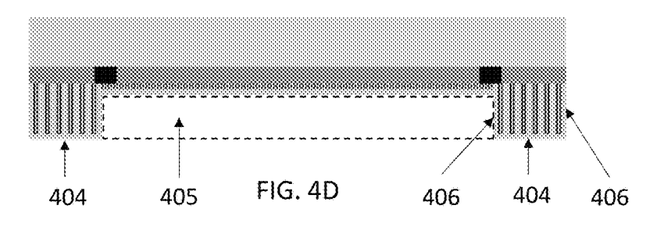

At 320, electrical structures including active and passive electrical components on the front-side 402 of the chip die 400 may be formed using any suitable and well-known semiconductor manufacturing techniques. For example, all electrical structures on the front-side 402 may be implemented by standard work flow. Standard work flow may include forming an epitaxial layer to prepare the front surface of the substrate, using lithography techniques to pattern individual electrical components on the substrate, and forming metal interconnect layers.

Active electrical components 430 that should have thinner substrates may be formed in portions of the chip die containing a buried etch stop layer 410. Passive electrical components 420 that should have thicker substrates may be formed in the remaining portions of the chip die. Referring to FIG. 4B, one or more active components (e.g., transistors) may be formed in or over the portions of the chip die where there is a buried etch stop layer 410 and one or more passive component (e.g., deep trench capacitors) may be formed in the portions of the chip die along the chip-edge or any other portion of the chip die where there is no buried etch stop layer 410. Each of the one or more deep trench capacitors may have a plurality of trenches. Depending on the etching process used, a portion of the chip die forming the side walls 406 of a support structure may also be etched away. Thus, the first and last trenches formed in the support structure of the chip die may form part of the edge face of a chip die or a side wall of a cavity. The first and last trenches may be formed so that it they are resistant to subsequent silicon substrate etching techniques to act as a vertical etch stop layer.

A front-side metal layer 450 may be formed above the electrical components 420 and 430. An imide 455 may be used to separate the front-side metal layer and to ensure electrical insulation. It is usually used for voltage termination in chip edge structures.

Through-Silicon-Vias (TSVs) may be used to create vertical connections through the body of the chips for various interconnections. TSVs may be used to combine passive components with active component circuits. TSVs may also be used to connect multiple active component circuits together.

At 330, the front-side 402 of the chip die 400 may be mounted with adhesives on a glass carrier 460 that provides mechanical support while the back-side 403 of the chip die 400 is processed. Once the chip die is mounted, the entire back-side 403 of the chip die 400 may be thinned. For example, the back-side 403 may be grounded by any suitable and well-known back-side grinding method may be used. At this process, the thickness of the semiconductor substrate is uniform throughout the chip die and may be in the range from about 10 μm to about 100 μm. In various embodiments, the thickness may be in the range from about 100 μm to about 200 μm At 340, a back-side lithography process may be used to etch away the silicon substrate in certain areas on the back-side of the chip die. A patterned etch resistant layer may be formed on back-side of the chip die. The patterned etch resistant layer may be used to mask areas of the chip die that contain passive components or will serve as support structures. For example, referring to FIG. 4C, the areas along the chip-edge may be masked with an etch stop layer 470. Next, the silicon substrate between the unmasked portions of the back-side surface and the buried etch stop layer 410 may be removed to form a recess 405 on the back-side of the substrate and a support structure 404 around the edge of the chip die. For example, a plasma etch process may be used to remove most of the bulk silicon in the areas not protected by an etch stop layer 470. A subsequent wet chemical process with an etch-stop resist attacks all open silicon areas and stops at the buried etch stop layer 410. The side walls 406 of the support structure 404 may be configured to be resistant to the etching process. For example, referring to FIGS. 4B-4D, where a deep trench capacitor is formed in the support structure 404, the first and last trenches of the deep trench capacitor may be filled with an etch resistant material. When the etching is completed, the buried etch stop layer 410 and the etch stop layer 470 may be removed by a different etchant.

Figure 4E:
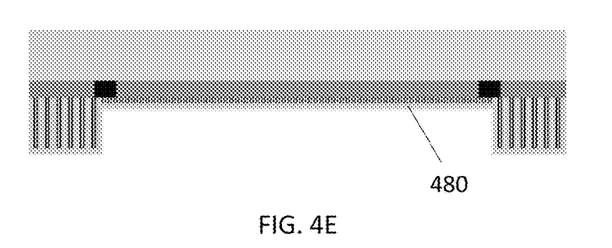

At 350, a diffusion barrier layer 480 may be deposited on the back-side of the substrate. Suitable diffusion barrier deposition methods include sputtering. As shown in FIG. 4E, the diffusion barrier layer 480 may be applied to any exposed silicon surfaces on back-side of the substrate. The diffusion barrier layer 480 prevents diffusion of metal ions from the metallization layer into the silicon substrate. Barrier layers may be formed from tungsten, tungsten nitride, or titanium nitride.

Figure 4F:
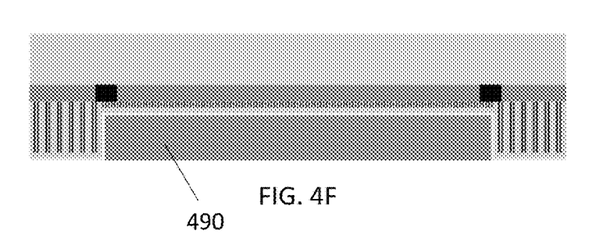

At 360, any recesses on the back-side of the chip die may be filled to form a support layer for the thinned substrate. In various embodiments, the support layer may also function as a heatsink for the one or more active components formed on the thinned substrate. In various embodiments, the support layer may also function as an electrical contact for the one or more active components. As shown in FIG. 4F, recess 405 on the back-side of the chip die may be deposited with a low stress metal such as for example copper including porous copper 490. Suitable deposition methods include spraying, screen printing, or electroplating (galvanic deposition). A recess may be completely filled or partially filled.

Figure 5:
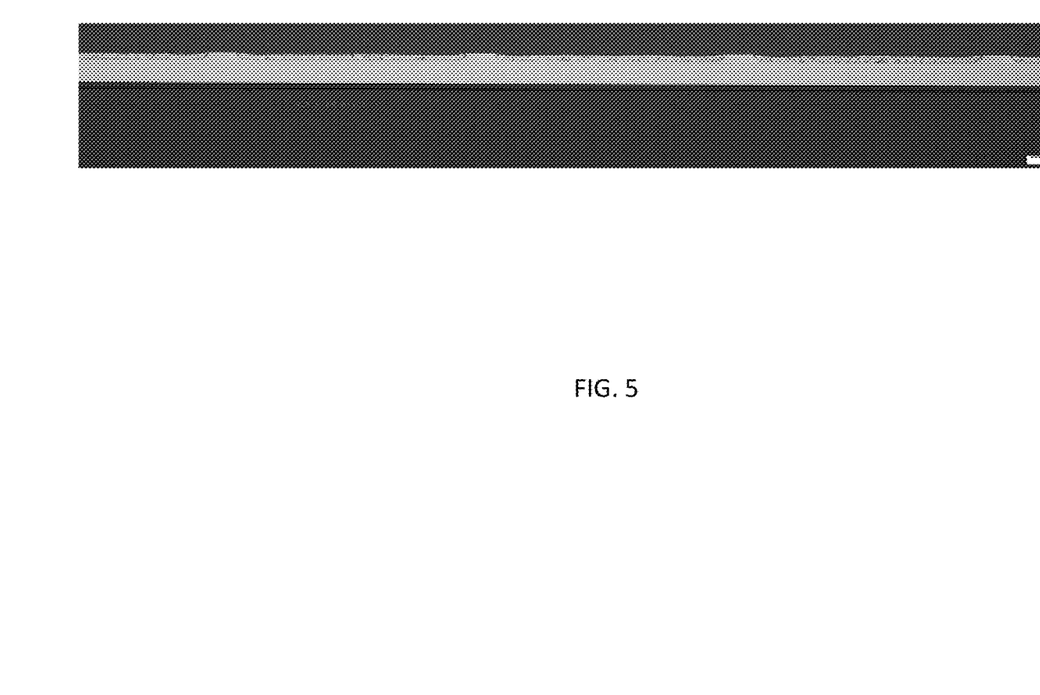
FIG. 5 shows a cross-section view of a semiconductor wafer having 30 µm deep recesses filled with printed copper.

Copper paste printing may be a suitable alternative for electroplating, especially where thick copper layers (up to 100 μm) are required. Copper paste may be deposited into the recesses of the chip die through pre-defined apertures in a stencil or screen. For example, one experiment shows that this process is suitable to fill recesses having an area of greater than 200×200 µm² and depths of at least 30 µm. FIG. 5 shows a semiconductor wafer including printed copper in a plurality of recesses between support structures, where the recesses were 30 µm deep.

Figure 6A:
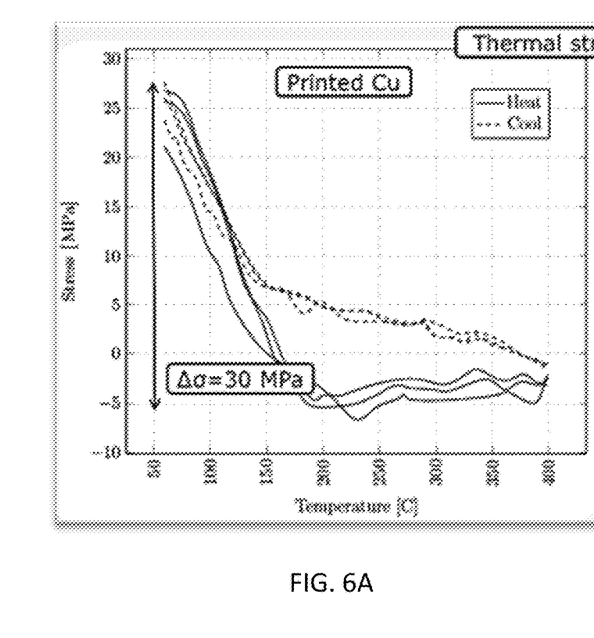
FIGS. 6A-6B show two charts comparing the amount of wafer bow between a semiconductor wafer having recesses filled with printed copper and a semiconductor wafer having recesses filled with electroplated copper.
Figure 6B:
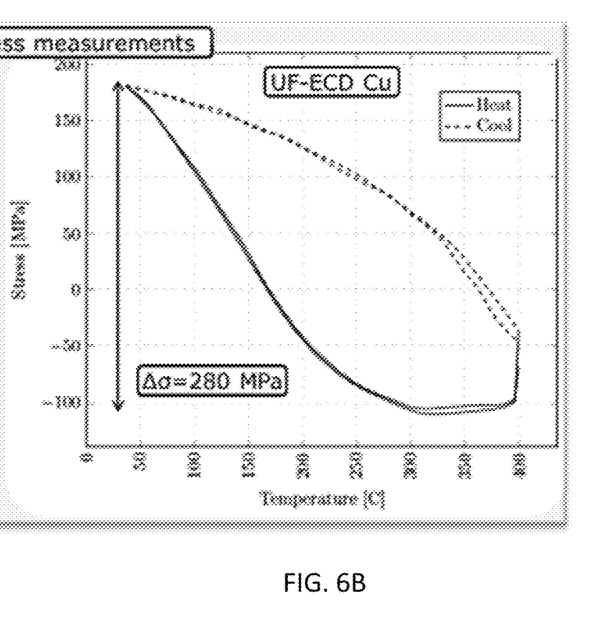

A conducting porous copper network may be formed from the printed copper layers in a subsequent curing process with a maximum temperature between about 240° C. and about 400° C. As high-temperature processing on a glass carrier is difficult due to the lower melting temperature of the mounting adhesive, this high-temperature curing process may be either realized only on chip-level during soldering or on wafer level up to 240° C. A first curing process on a glass carrier to remove organic solvents can be done by temperatures below 200° C., which are less critical for the glue. FIGS. 6A-6B show two charts comparing the amount of wafer bow between a semiconductor wafer having recesses filled with printed copper and a semiconductor wafer having recesses filled with electroplated copper. As shown in FIGS. 6A and 6B, due to the porous structure of the resulting copper layers, the wafer bow during thermal cycling is reduced by up to 90%, which is especially relevant for thin silicon substrates.

The printed copper may also be used as a heatsink or an electrical connector. Electroplated copper has better electrical and thermal conductivity than printed copper. The electrical and thermal conductivity of printed copper are about 50% less compared to the electrical and thermal conductivity of electroplated copper but the reduction of the heat capacity can be counter-acted by increasing the layer thickness.

Depending on the metallization process, the diffusion barrier layer 480 may be covered by a thin conductive film ("seed layer") which is connected with the front-side metal layer to realize a continuous, electrical contact to an external power source. A copper seed layer ranging from about 150 nm to about 300 nm thick should be sufficient. The aspect ratios of the side walls of the recesses should be suitable for sputtering both the diffusion barrier layer and seed layer.

In various embodiments, process 300 or a similar process may be used to provide a chip die having one or more cavities on the back-side of the chip die.

Figure 7A:
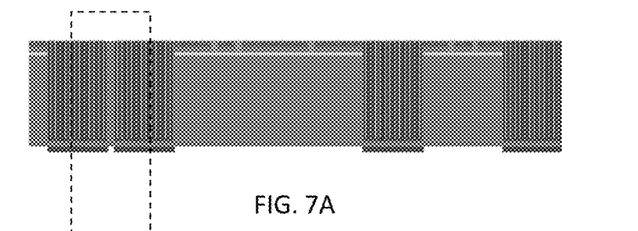
FIGS. 7A-7E are cross-sectional views of a chip die in various stages in forming a monolithically integrated circuit with one or more active electrical components and one or more passive electrical components according to various embodiments.
Figure 7B:
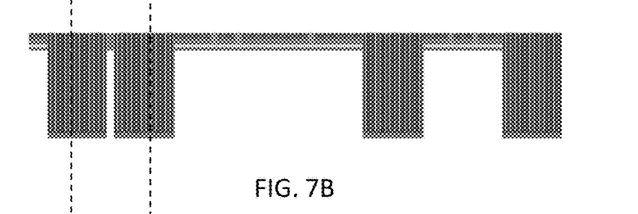
Figure 7C:
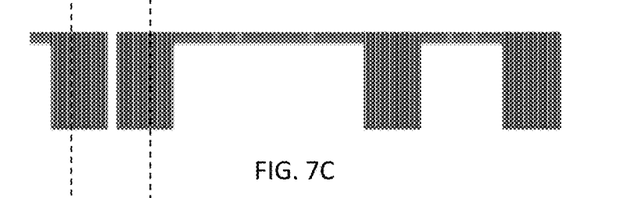
Figure 7D:
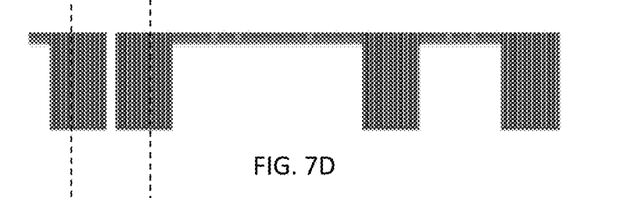
Figure 7E:
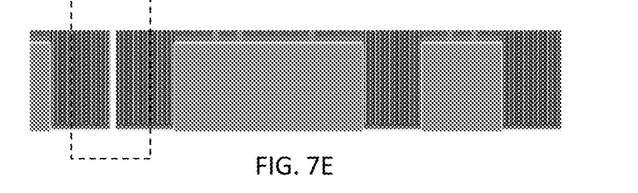

In various embodiments, the back-side lithography techniques used to remove semiconductor material from certain areas in the back-side of the chip die may also be used for die-separation to divide the wafer into individual chips. FIGS. 7A-7E are cross-sectional views of a chip die in various stages in forming a monolithically integrated circuit with one or more active electrical components and one or more passive electrical components according to various embodiments. The dotted box indicates the edges of two chip dies. Referring to FIG. 7B, since there is no back-side resist layer to mask the portion of the semiconductor material between two chip dies, plasma etching may be used to remove the bulk of the silicon in this region. Referring to FIG. 7C, since there is no buried etch stop layer in the kerf area (i.e., the portion of the semiconductor material between two chip dies), wet etching may be used to remove the remaining silicon in the kerf area which completely separates the two chip dies.

In accordance with various embodiments, at least one active electrical component (e.g., a transistor) and at least one passive electrical component (e.g., resistor, inductor, or capacitor) are each monolithically integrated in a semiconductor device.

In the following, various aspects of this disclosure will be illustrated:

Example 1 is an integrated circuit device including a chip die having a first area with a first thickness surrounding a second area with a second thickness, the first thickness is greater than the second thickness, the chip die having a front-side and a back-side, at least one passive electrical component provided at least one of in or over the chip die in the first area on the front-side, and at least one active electrical component provided at least one of in or over the chip die in the second area on the front-side.

In Example 2, the subject matter of Example 1 can optionally include a support layer disposed on or over the chip die in the second area on the back-side in a direction away from the front-side.

In Example 3, the subject matter of any one of Examples 1 or 2 can optionally include that the at least one passive electrical component is at least one deep trench capacitor.

In Example 4, the subject matter of any one of Examples 1-3 can optionally include that the at least one active electrical component is at least one power transistor.

In Example 5, the subject matter of any one of Examples 1-4 can optionally include the thickness of the support layer is at least about 1 µm.

In Example 6, the subject matter of any one of Examples 2-5 can optionally include that the support layer is a metal layer.

In Example 7, the subject matter of any one of Examples 1-6 can optionally include that the second thickness is in the range from about 2 µm to about 20 µm.

In Example 8, the subject matter of any one of Examples 1-7 can optionally include that the first thickness ranges from about 10 µm to about 100 µm.

In Example 9, the subject matter of any one of Examples 2-8 can optionally include that the metal layer is low stress metal.

In Example 10, the subject matter of any one of Examples 2-9 can optionally include that the metal layer is electrically coupled to at least one of the at least one active electrical component or the at least one passive electrical component.

In Example 11, the subject matter of any one of Examples 1-10 can optionally include that the chip die in the first area includes a perimeter of the chip die.

Example 12 is an integrated circuit device including a chip die including at least one recess on a back-side of the chip die, the at least one recess comprising a roof and at least a portion of a support structure surrounding the at least one recess, at least one active electrical component formed at least one of in or over a front-side of the portion of the chip die that comprises the roof, at least one passive electrical component formed at least one of in or over a front-side of the portion of the chip die that comprises the support structure.

In Example 13, the subject matter of Example 12 can optionally include a support layer disposed in the at least one recess.

In Example 14, the subject matter of any one of Examples 12 or 13 can optionally include that the at least one passive electrical component is at least one deep trench capacitor.

In Example 15, the subject matter of any one of Examples 12-14 can optionally include that the at least one active electrical component is at least one transistor.

In Example 16, the subject matter of any one of Examples 13-15 can optionally include that the support layer is a metal layer.

In Example 17, the subject matter of any one of Examples 12-16 can optionally include that the thickness of the roof is in the range from about 2 µm to about 20 µm.

In Example 18, the subject matter of any one of Examples 12-17 can optionally include that the thickness of the chip die is in the range from about 10 μm to about 200 μm.

In Example 19, the subject matter of any one of Examples 13-18 can optionally include that the metal layer is electrically coupled to at least one of the at least one active electrical component or the at least one passive electrical component.

In Example 20, the subject matter of any one of Examples 12-19 can optionally include that the depth of the at least one recess in in the range from about 10 μm to about 190 μm.

In Example 21, the subject matter of any one of Examples 12-20 can optionally include that the width of the support structure is in the range from about 1 μm to about 1 cm.

In Example 22, the subject matter of any one of Examples 12-21 can optionally include that the metal layer is porous copper.

Example 23 is a method of processing a chip die having a front-side and a back-side, including: forming an active component at least one of in or over the front-side of the chip die in a first area, forming a passive component at least one of in or over the front-side of the chip die in a second area, and forming a recess in the back-side of the chip die in the first area.

In Example 24, the subject matter of Example 23 can optionally include that forming a recess further includes: mounting the front-side of the chip die on to a glass carrier and grinding the back-side of the chip die until the thickness of the chip die is in the range of about 20 to about 200 μm.

In Example 25, the subject matter of any of Examples 23 or 24 can optionally include forming a support layer in the recess.

In Example 26, the subject matter of Example 25 can optionally include that forming a support layer includes depositing a low stress metal into the recess.

In Example 27, the subject matter of any of Examples 23-26 can optionally include applying a diffusion barrier layer on the back-side of the semiconductor substrate.

In Example 28, the subject matter of any of Examples 23-27 can optionally include providing a patterned buried etch stop layer on or below a front-side surface of the chip die, the patterned buried etch stop layer masking the first area and exposing the second area, providing a patterned etch stop layer on a back-side surface of the chip die, the patterned etch stop layer masking the second area and exposing the first area, removing at least a portion of the chip die between the back-side surface and the patterned buried etch stop layer in the first area; and removing the patterned buried etch stop layer and the patterned etch stop layer.

In Example 29, the subject matter of any of Examples 23-28 can optionally include that forming a passive component further includes forming trenches in the front-side of the chip die in the second area.

In Example 30, the subject matter of any of Examples 23-29 can optionally include that the first area is surrounded by the second area.

In Example 31, the subject matter of any of Examples 23-30 can optionally include that the second area includes an edge of the chip die.

In Example 32, the subject matter of Example 31 can optionally include that the second area further includes an inner portion of the chip die.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit device, comprising:
a chip die having a first area with a first thickness surrounding a second area with a second thickness, the first thickness is greater than the second thickness, the chip die having a front-side and a back-side;
at least one passive electrical component provided at least one of in or over the chip die in the first area on the front-side; and
at least one active electrical component provided at least one of in or over the chip die in the second area on the front-side.

2. The integrated circuit device of claim 1, further comprising a support layer disposed on or over the chip die in the second area on the back-side in a direction away from the front-side.

3. The integrated circuit device of claim 2,
wherein the thickness of the support layer is at least 1 μm.

4. The integrated circuit device of claim 2,
wherein the support layer comprises a metal layer.

5. The integrated circuit device of claim 4,
wherein the metal layer comprises copper.

6. The integrated circuit device of claim 4,
wherein the metal layer is electrically coupled to at least one of the at least one active electrical component or the at least one passive electrical component.

7. The integrated circuit device of claim 1,
wherein the at least one passive electrical component is at least one deep trench capacitor.

8. The integrated circuit device of claim 7,
wherein a depth of the at least one deep trench capacitor ranges from 20 μm to 50 μm.

9. The integrated circuit device of claim 1,
wherein the at least one active electrical component is at least one power transistor.

10. The integrated circuit device of claim 1,
wherein the second thickness ranges from 2 μm to 20 μm.

11. The integrated circuit device of claim 1,
wherein the first thickness ranges from 10 μm to 200 μm.

12. The integrated circuit device of claim 1,
wherein the chip die in the first area comprises a perimeter of the chip die.

13. An integrated circuit device, comprising:
a chip die having a front-side and a back-side opposite the front-side, the chip die comprising a first portion having a first thickness and a second portion having a second thickness, wherein the first thickness is greater than the second thickness and the first thickness and the second thickness are determined between the front-side of the chip die and the back-side of the chip die, the chip die comprising at least one recess in the back-side of the chip die, the at least one recess defined at least by a side wall and a top wall, the side wall comprising at least a part of the first portion and the top wall comprising at least a part of the second portion;
at least one active electrical component formed at least one of in or over the top wall from the front-side of the chip die; and
at least one passive electrical component formed at least one of in or over the side wall from the front-side of the chip die.

14. The integrated circuit device of claim 13, further comprising a support layer disposed in the at least one recess.

15. The integrated circuit device of claim 14,
wherein the support layer comprises a metal layer.

16. The integrated circuit device of claim 15,
wherein the metal layer is electrically coupled to at least one of the at least one active electrical component or the at least one passive electrical component.
17. The integrated circuit device of claim 15,
wherein the metal layer comprises porous copper.
18. The integrated circuit device of claim 13,
wherein the at least one passive electrical component is at least one deep trench capacitor.
19. The integrated circuit device of claim 18,
wherein a depth of the at least one deep trench capacitor substantially ranges from 20 μm to 50 μm.
20. The integrated circuit device of claim 13,
wherein the at least one active electrical component is at least one transistor.
21. The integrated circuit device of claim 13,
wherein a thickness of the top wall ranges from 2 μm to 20 μm.
22. The integrated circuit device of claim 13,
wherein a thickness of the side wall ranges from 10 μm to 200 μm.
23. The integrated circuit device of claim 13,
wherein a depth of the at least one recess ranges from 10 μm to 190 μm.
24. The integrated circuit device of claim 13,
wherein a width of the side wall ranges from 1 μm to 1 cm.
25. The integrated circuit device of claim 13,
wherein the side wall comprises an edge of the chip die.

* * * * *

UNITED STATES PATENT AND TRADEMARK OFFICE
CERTIFICATE OF CORRECTION

PATENT NO. : 10,199,372 B2
APPLICATION NO. : 15/631006
DATED : February 5, 2019
INVENTOR(S) : Ingo Muri et al.

Page 1 of 1

It is certified that error appears in the above-identified patent and that said Letters Patent is hereby corrected as shown below:

Column 12, Line 52, Claim 13: please change "the back-side of the chip die," to --the back-side of the chip die of the respective first and second portions,--

Signed and Sealed this
Twenty-fifth Day of June, 2019

Andrei Iancu
*Director of the United States Patent and Trademark Office*